United States Patent
Yeung et al.

(10) Patent No.: US 10,361,269 B2
(45) Date of Patent: Jul. 23, 2019

(54) FORMING BOTTOM ISOLATION LAYER FOR NANOSHEET TECHNOLOGY

(71) Applicant: International Business Machines Corporation, Armonk, NY (US)

(72) Inventors: Chun W. Yeung, Niskayuna, NY (US); Chen Zhang, Guilderland, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/946,768

(22) Filed: Apr. 6, 2018

(65) Prior Publication Data

US 2018/0261670 A1  Sep. 13, 2018

Related U.S. Application Data

(63) Continuation of application No. 15/452,188, filed on Mar. 7, 2017, now Pat. No. 10,032,867.

(51) Int. Cl.
| | |
|---|---|
| *H01L 29/06* | (2006.01) |
| *H01L 29/66* | (2006.01) |
| *H01L 29/51* | (2006.01) |
| *H01L 29/78* | (2006.01) |
| *H01L 29/165* | (2006.01) |

(52) U.S. Cl.
CPC ...... *H01L 29/0673* (2013.01); *H01L 29/0649* (2013.01); *H01L 29/165* (2013.01); *H01L 29/51* (2013.01); *H01L 29/66439* (2013.01); *H01L 29/66545* (2013.01); *H01L 29/66795* (2013.01); *H01L 29/785* (2013.01)

(58) Field of Classification Search
CPC ............. H01L 29/0673; H01L 29/0649; H01L 29/165; H01L 29/51; H01L 29/66545; H01L 29/66795; H01L 29/785
See application file for complete search history.

(56) References Cited

U.S. PATENT DOCUMENTS

| | | | |
|---|---|---|---|
| 7,892,945 B2 | 2/2011 | Bedell et al. | |
| 8,753,942 B2 | 6/2014 | Kuhn et al. | |
| 8,951,850 B1 | 2/2015 | He et al. | |
| 9,041,106 B2 | 5/2015 | Cappellani et al. | |
| 9,362,355 B1 | 6/2016 | Cheng et al. | |
| 9,881,998 B1 * | 1/2018 | Cheng | H01L 29/0649 |
| 9,923,055 B1 * | 3/2018 | Cheng | H01L 29/0665 |

(Continued)

OTHER PUBLICATIONS

U.S. Appl. No. 15/422,572 filed in the name of Kangguo Cheng et al. On Feb. 2, 2017 and entitled "Stacked Nanosheet Field Effect Transistor Device with Substrate Isolation."

(Continued)

*Primary Examiner* — Christine A Enad
(74) *Attorney, Agent, or Firm* — Vazken Alexanian; Ryan, Mason & Lewis, LLP

(57) ABSTRACT

A method of forming a semiconductor structure includes forming a multi-layer structure. The multi-layer structure has a substrate and two or more nanosheet layers formed above the substrate. The method also includes forming a bottom isolation layer between the substrate and the two or more nanosheet layers. The method further includes performing a fin reveal in the multi-layer structure after formation of the bottom isolation layer to form a fin. The two or more nanosheet layers provide a channel stack for a nanosheet field-effect transistor.

18 Claims, 22 Drawing Sheets

(56) References Cited

U.S. PATENT DOCUMENTS

| | | | |
|---|---|---|---|
| 10,032,867 B1* | 7/2018 | Yeung | H01L 29/66439 |
| 2014/0001441 A1 | 1/2014 | Kim et al. | |
| 2014/0225065 A1 | 8/2014 | Rachmady et al. | |
| 2014/0312432 A1* | 10/2014 | Ching | H01L 29/66795 |
| | | | 257/401 |
| 2015/0069328 A1 | 3/2015 | Leobandung | |
| 2015/0303258 A1 | 10/2015 | Kuhn et al. | |
| 2016/0035849 A1* | 2/2016 | Ching | H01L 29/42392 |
| | | | 257/27 |
| 2016/0190285 A1 | 6/2016 | Doris et al. | |
| 2017/0179299 A1* | 6/2017 | Bae | H01L 29/78609 |
| 2017/0250250 A1* | 8/2017 | Bentley | H01L 29/0673 |
| 2017/0250291 A1* | 8/2017 | Lee | H01L 29/66545 |

OTHER PUBLICATIONS

U.S. Appl. No. 15/339,283, filed Oct. 31, 2016.
List of IBM Patents or Patent Applications Treated as Related.

* cited by examiner

250

200

300

275

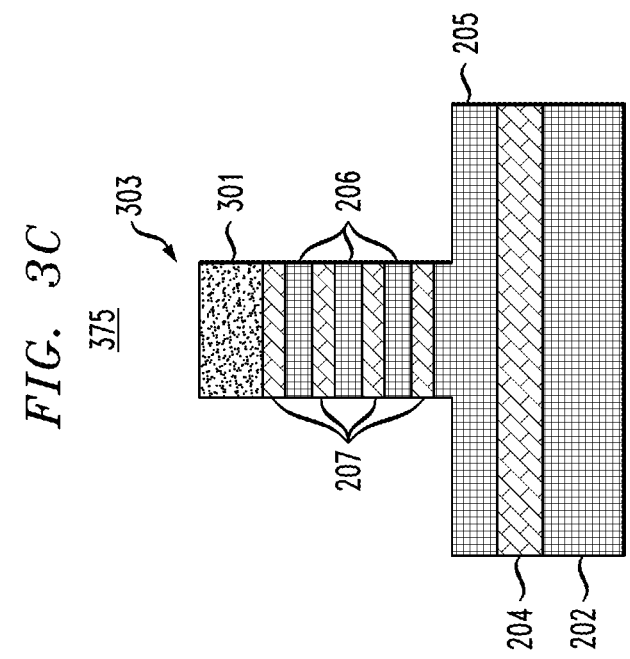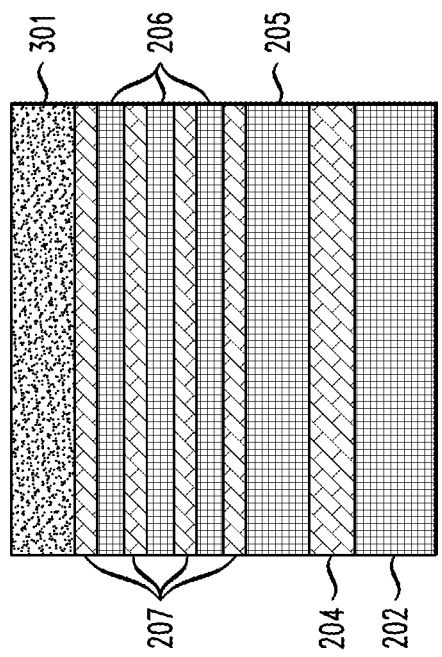

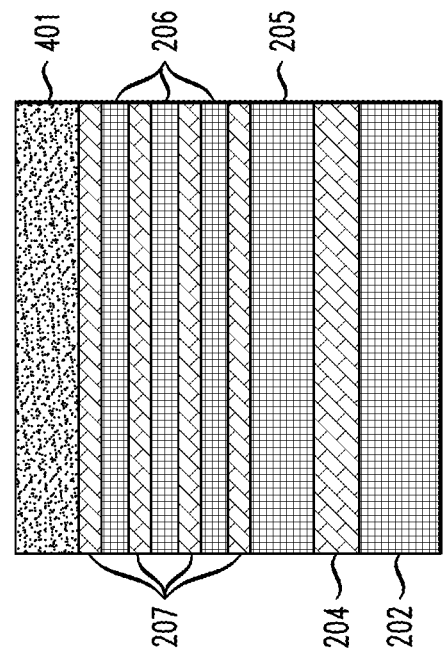
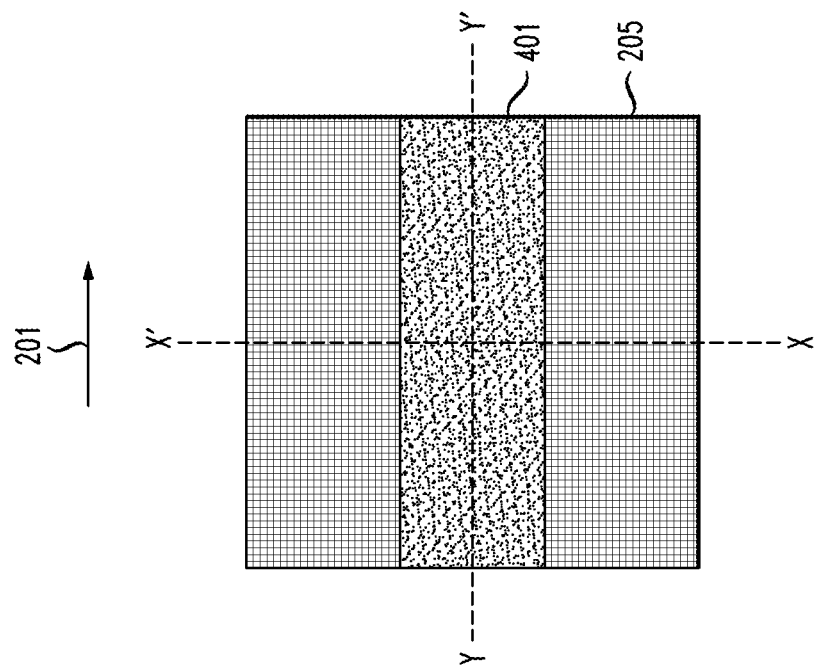

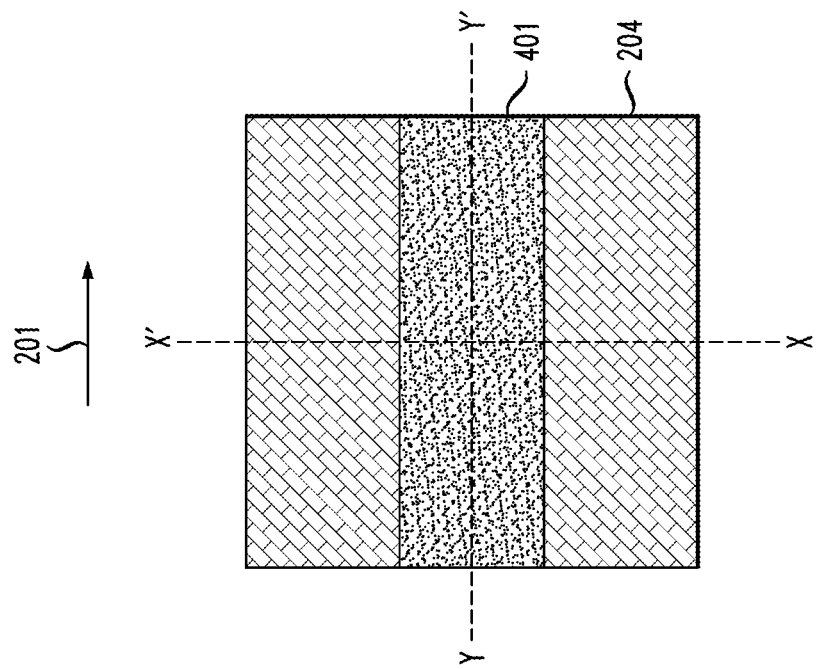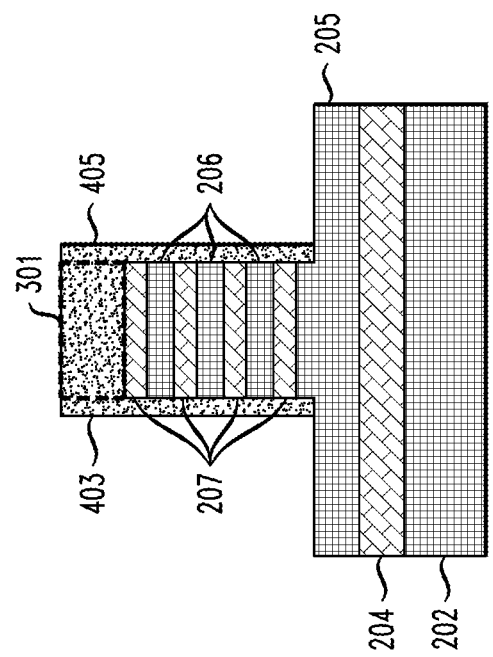

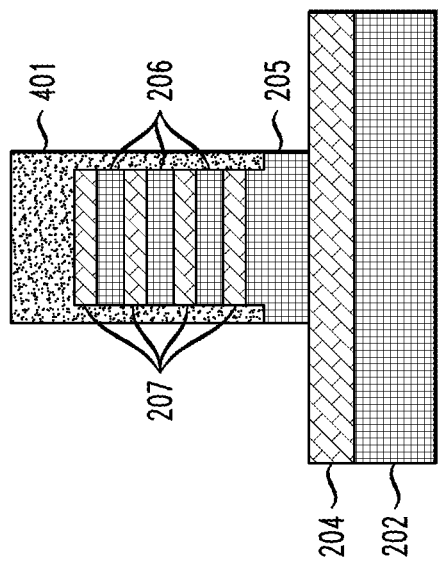
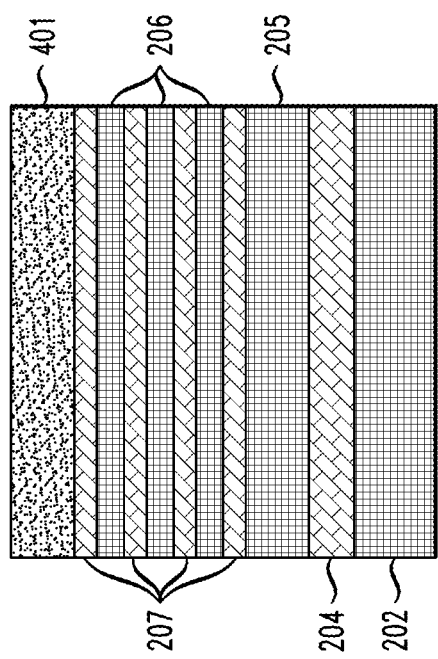

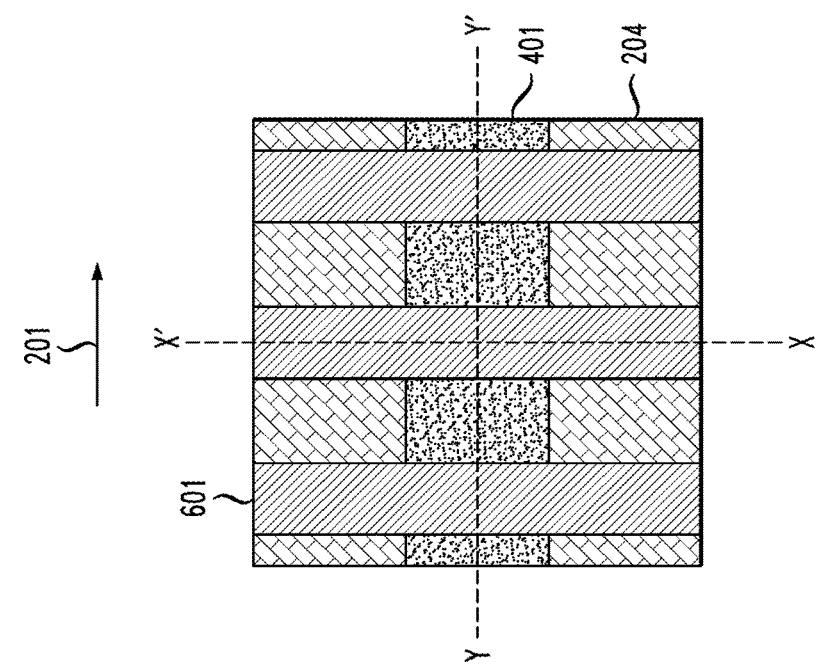
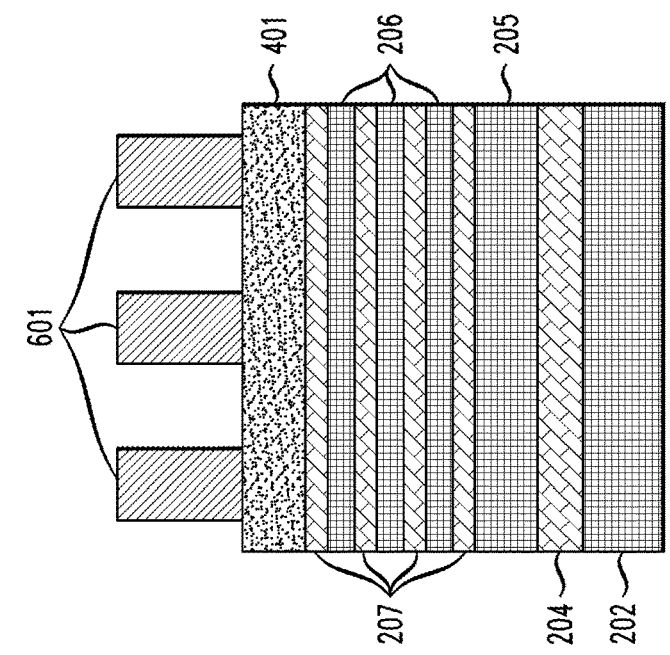

675

700

775

750

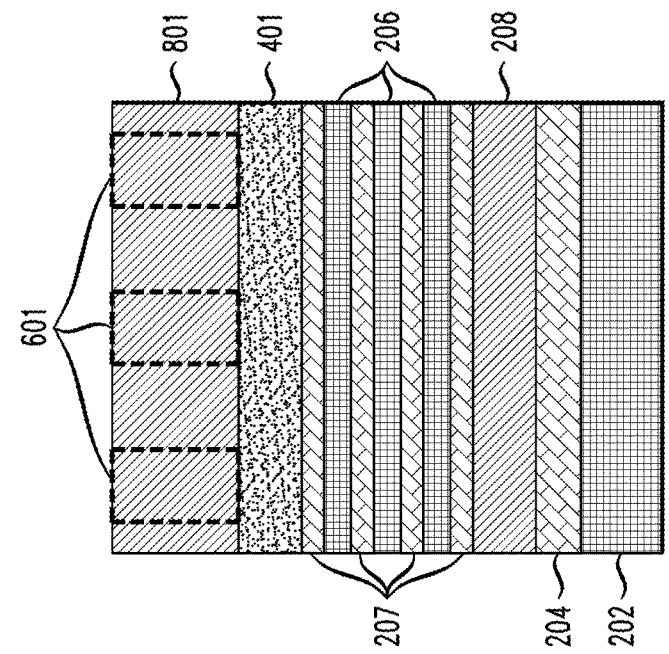
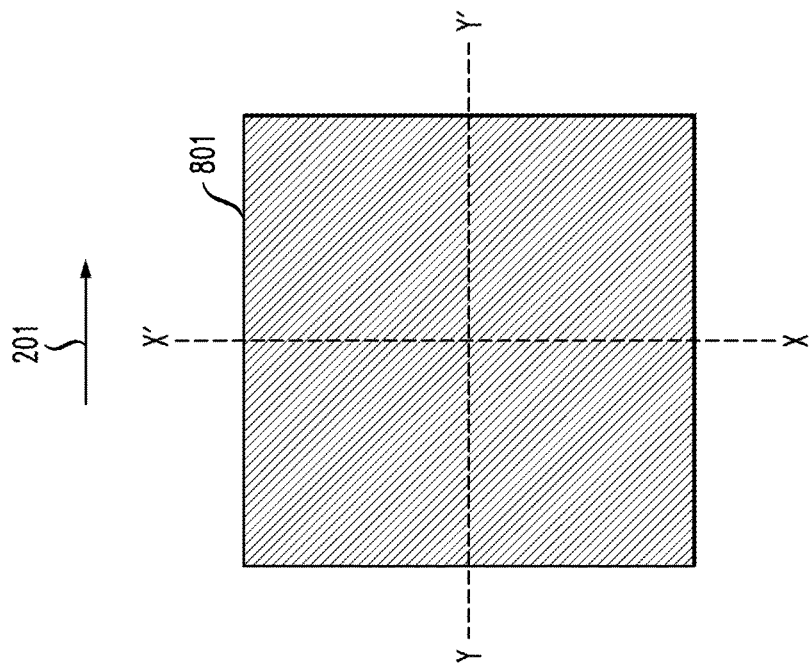

900

875

975

950

1050

1000

1100

1075

1175

1150

1250

1200

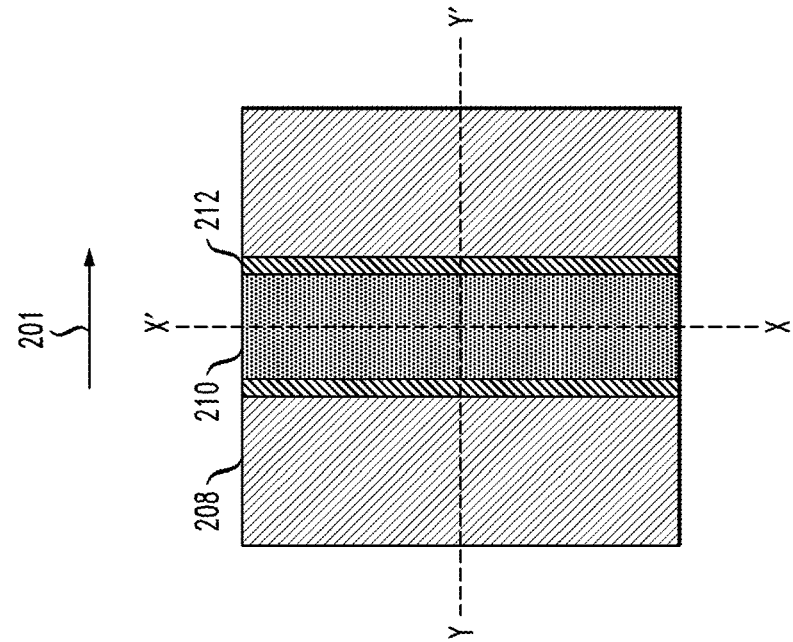
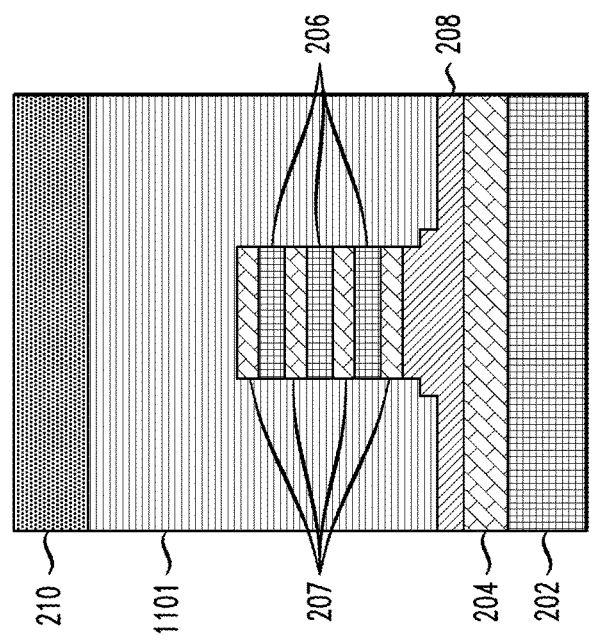

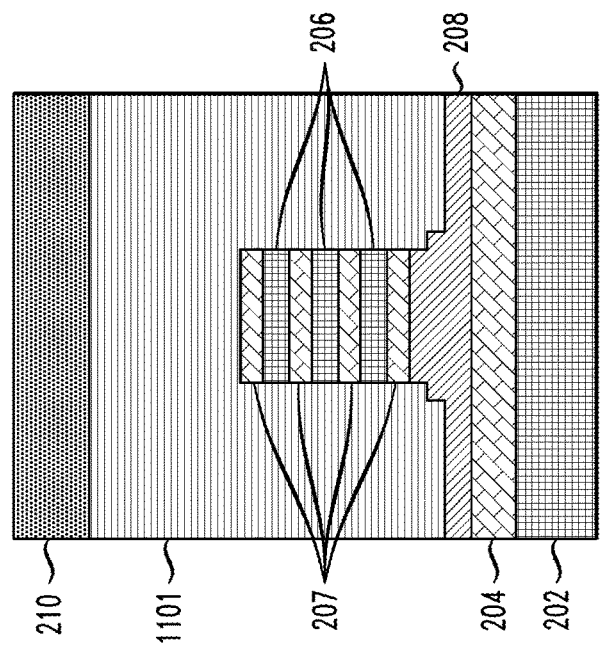
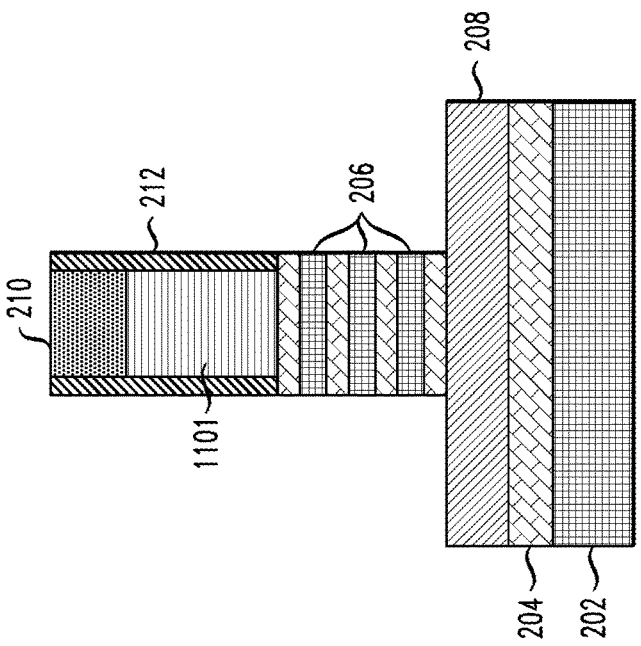
FIG. 13C
1375
FIG. 13B
1350

1400

1450

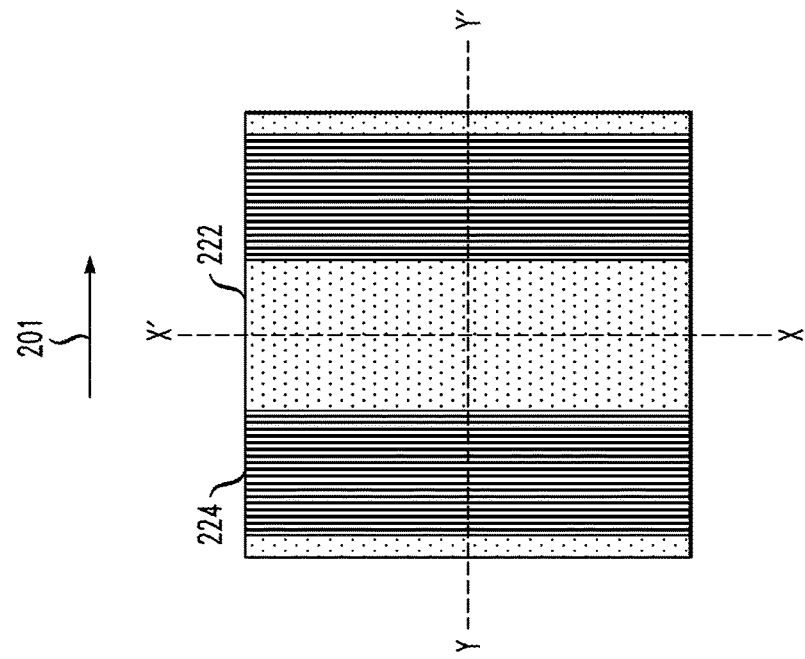
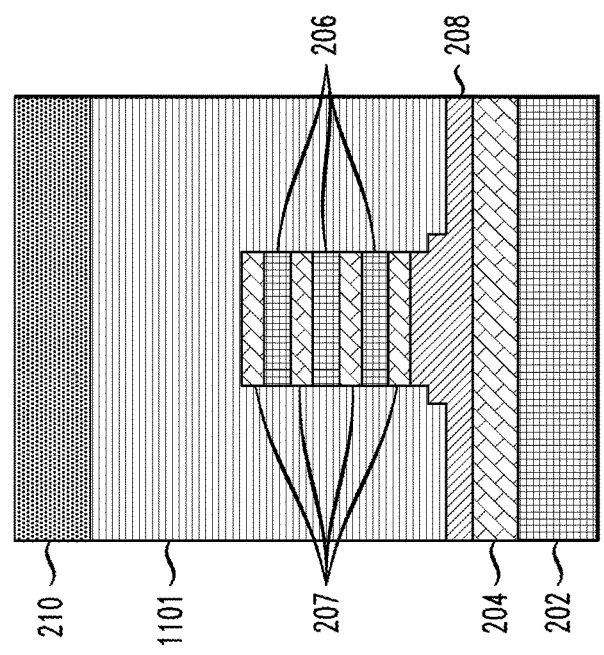

1575

1550

US 10,361,269 B2

FORMING BOTTOM ISOLATION LAYER FOR NANOSHEET TECHNOLOGY

BACKGROUND

The present application relates to semiconductors, and more specifically, to techniques for forming semiconductor structures. Semiconductor devices such as semiconductor fin field-effect transistors (FinFETs) are an evolution of complementary metal-oxide-semiconductor (CMOS) devices. Nanosheet technology may be used in some semiconductor devices including FinFET devices with a device channel comprising one or more layers of nanosheets. Each nanosheet has a vertical thickness substantially less than the width of that nanosheet. Gate structures may be formed above and below each nanosheet.

SUMMARY

Embodiments of the invention provide techniques for forming a bottom isolation layer below nanosheet channels.

For example, in one embodiment a method of forming a semiconductor structure comprises forming a multi-layer structure comprising a substrate and two or more nanosheet layers formed above the substrate, forming a bottom isolation layer between the substrate and the two or more nanosheet layers, and performing a fin reveal in the multi-layer structure after formation of the bottom isolation layer to form at least one fin, wherein the two or more nanosheet layers provide a channel stack for a nanosheet field-effect transistor.

In another embodiment, a semiconductor structure comprises a multi-layer structure comprising a substrate and two or more nanosheet layers disposed above the substrate, and a bottom isolation layer disposed between the substrate and the two or more nanosheet layers. The two or more nanosheet layers provide a channel stack for a nanosheet field-effect transistor.

In another embodiment, an integrated circuit comprises a nanosheet field-effect transistor comprising a multi-layer structure comprising a substrate and two or more nanosheet layers disposed above the substrate, and a bottom isolation layer disposed between the substrate and the two or more nanosheet layers. The two or more nanosheet layers provide a channel stack for the nanosheet field-effect transistor.

BRIEF DESCRIPTION OF THE DRAWINGS

FIG. 3B illustrates a first cross-sectional view of the FIG. 3A structure, according to an embodiment of the present invention.

FIG. 3C illustrates a second cross-sectional view of the FIG. 3A structure, according to an embodiment of the present invention.

FIG. 4A illustrates a top-down view of the structure shown in FIGS. 3A-3C following formation of an additional layer on the fin sidewall, according to an embodiment of the present invention.

FIG. 4B illustrates a first cross-sectional view of the FIG. 4A structure, according to an embodiment of the present invention.

FIG. 4C illustrates a second cross-sectional view of the FIG. 4A structure, according to an embodiment of the present invention.

FIG. 5A illustrates a top-down view of the structure shown in FIGS. 4A-4C following etching of a sacrificial layer, according to an embodiment of the present invention.

FIG. 5B illustrates a first cross-sectional view of the FIG. 5A structure, according to an embodiment of the present invention.

FIG. 5C illustrates a second cross-sectional view of the FIG. 5A structure, according to an embodiment of the present invention.

FIG. 6A illustrates a top-down view of the structure shown in FIGS. 5A-5C following formation of anchors, according to an embodiment of the present invention.

FIG. 6B illustrates a first cross-sectional view of the FIG. 6A structure, according to an embodiment of the present invention.

FIG. 8A illustrates a top-down view of the structure shown in FIGS. 7A-7C following filling the structure with an oxide, according to an embodiment of the present invention.

FIG. 8B illustrates a first cross-sectional view of the FIG. 8A structure, according to an embodiment of the present invention.

FIG. 12C illustrates a second cross-sectional view of the FIG. 12A structure, according to an embodiment of the present invention.

FIG. 13A illustrates a top-down view of the structure shown in FIGS. 12A-12C following etching, according to an embodiment of the present invention.

FIG. 13B illustrates a first cross-sectional view of the FIG. 13A structure, according to an embodiment of the present invention.

FIG. 13C illustrates a second cross-sectional view of the FIG. 13A structure, according to an embodiment of the present invention.

FIG. 14C illustrates a second cross-sectional view of the FIG. 14A structure, according to an embodiment of the present invention.

FIG. 15A illustrates a top-down view of the structure shown in FIGS. 14A-14C following formation of contacts, according to an embodiment of the present invention.

DETAILED DESCRIPTION

Illustrative embodiments of the invention may be described herein in the context of illustrative methods for forming a bottom isolation layer below nanosheet channels, along with illustrative apparatus, systems and devices having a bottom isolation layer formed using such methods. However, it is to be understood that embodiments of the invention are not limited to the illustrative methods, apparatus, systems and devices but instead are more broadly applicable to other suitable methods, apparatus, systems and devices.

Various embodiments provide techniques for forming a bottom isolation layer for bulk nanosheet technology. Methods for forming the bottom isolation layer in some embodiments do not utilize any oxidation steps, providing a number of advantages including avoiding potential intermix between channel materials, such as silicon (Si) and silicon germanium (SiGe), and avoiding unwanted material volume expansion.

In some embodiments, a bottom isolation layer (also referred to herein as a bottom insulation layer) is formed in nanosheet CMOS technology starting from a bulk semiconductor substrate. Embodiments form the bottom isolation layer by anchoring a channel portion of a structure with oxide pillars, such as silicon dioxide ($SiO_2$) pillars, and performing undercut etching underneath nanosheet channels and filling the structure with an oxide such as $SiO_2$. A fin reveal process is formed after filing the structure with the oxide. Thus, the resulting structure in some embodiments includes a planar nanosheet metal-oxide-semiconductor field-effect transistor MOSFET) with a bottom isolation layer such as $SiO_2$ insulation underneath the nanosheet channels. A SiGe etch stop layer may be used between the bottom isolation layer and the very bottom Si substrate.

Figure 1:
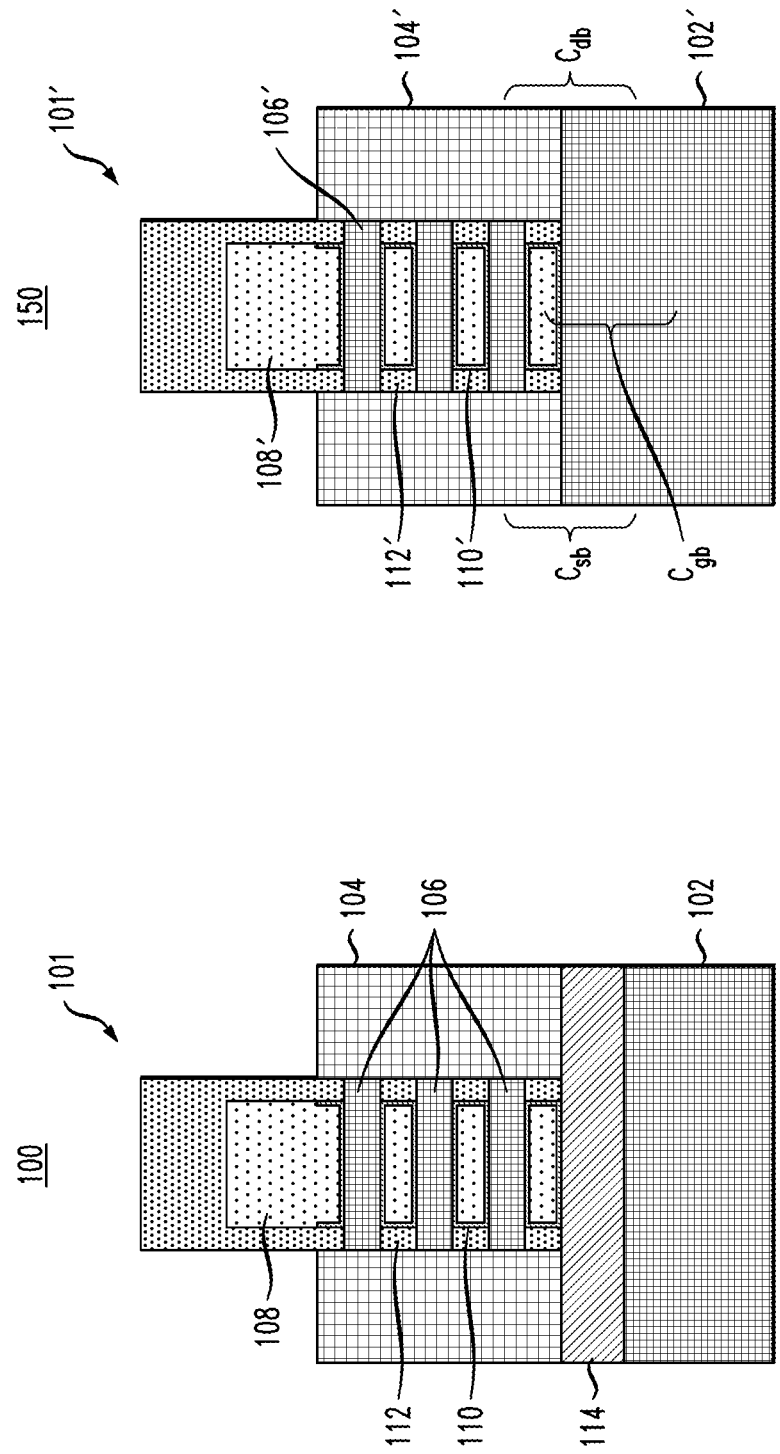
FIG. 1 depicts side cross-sectional views of a structure with and without a bottom isolation layer, according to an embodiment of the present invention.

FIG. 1 shows a side cross-sectional view 100 of a structure 101 with a bottom isolation layer along with a side cross-sectional view 150 of a structure 101' without a bottom isolation layer. The structure 101 includes a substrate 102, epitaxial layers 104, nanosheets 106, metal gates 108 shown formed above and below each of the nanosheets 106, dielectric layers 110 surrounding the gates 108, spacers 112 formed between the nanosheets 106, and a bottom isolation layer 114.

The structure 101' includes a substrate 102', epitaxial layers 104', nanosheets 106', metal gates 108' shown formed above and below each of the nanosheets 106', dielectric layers 110' surrounding the gates 108', and spacers 112' formed between the nanosheets 106'. The structure 101' does not include a bottom isolation layer.

The materials and dimensions of the substrate 102', epitaxial layers 104', nanosheets 106', metal gates 108', dielectric layers 110' and spacers 112' in structure 101' may be similar to corresponding elements in structure 101. The substrate 102' in structure 101', however, may be thicker than the substrate 102 in structure 101 as the structure 101' does not include a bottom isolation layer.

As shown in FIG. 1, the junction capacitance in structure 101' is labeled as $C_{sb}$ and $C_{db}$ for the source and drain, respectively. In some embodiments, $C_{sb}=C_{db}=C_j$, where $C_j$ represents the junction capacitance. The gate-to-substrate capacitance in structure 101' is labeled as $C_{gb}$. Both $C_j$ an $C_{gb}$ are unwanted parasitic capacitance and can be fairly large as the bottom substrate needs to be highly doped to suppress the bottom parasitic planar channel. By adding the bottom isolation layer 114, the structure 101 has greatly reduced $C_{gb}$ and $C_j$ relative to the structure 101'. In addition, the bottom isolation layer 114 can eliminate any current leakage from the bottom planar channel.

A process flow for forming a bottom isolation layer for bulk nanosheet technology will now be described. As will be detailed below, in some embodiments no oxidation steps are used so that any potential intermix between Si and SiGe and unwanted material volume expansion are avoided.

Figure 2B:
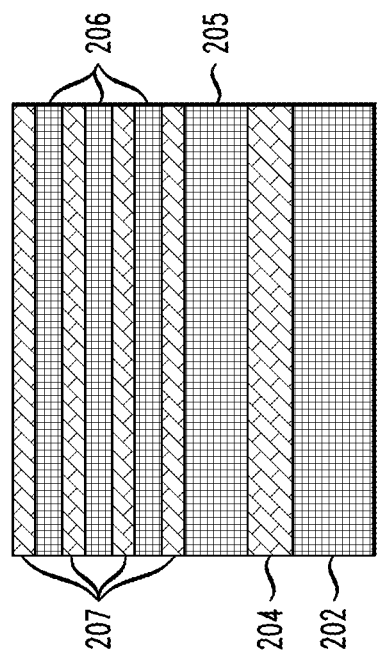
FIG. 2B illustrates a first cross-sectional view of the FIG. 2A structure, according to an embodiment of the present invention.
Figure 2A:
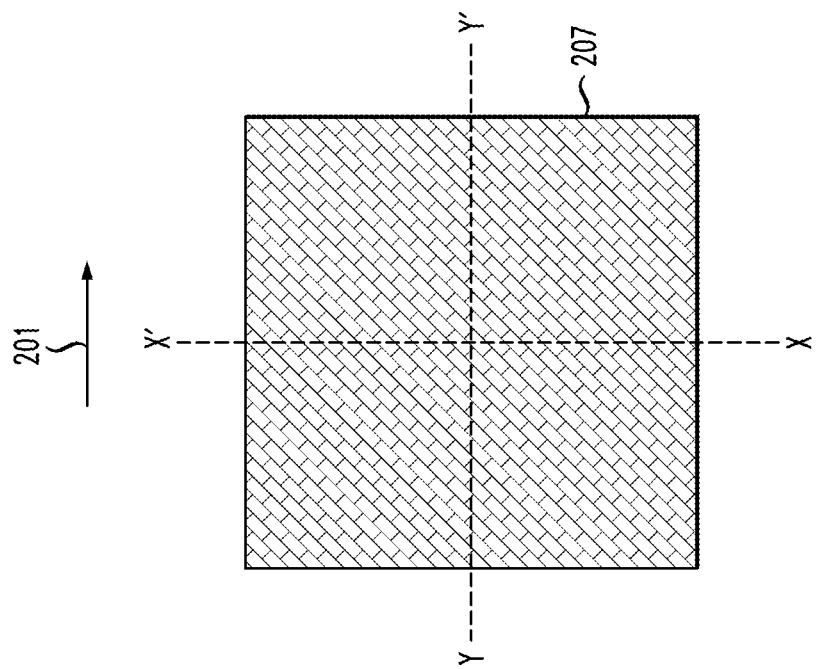
FIG. 2A illustrates a top-down view of a structure, according to an embodiment of the present invention.
Figure 2C:
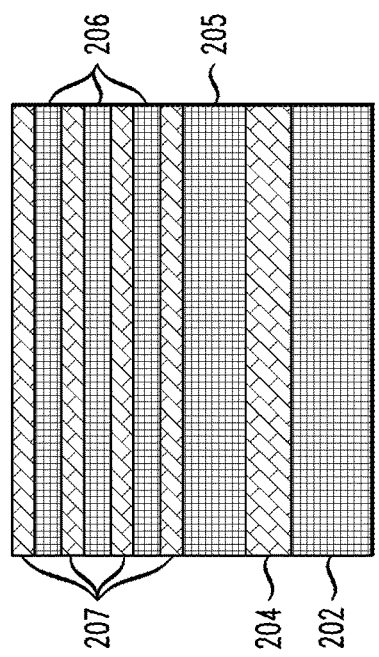
FIG. 2C illustrates a second cross-sectional view of the FIG. 2A structure, according to an embodiment of the present invention.

FIG. 2A illustrates a top-down view 200 of a structure. FIG. 2B illustrates a first cross-sectional view 250 of the structure taken along the line Y-Y' shown in FIG. 2A. FIG. 2C illustrates a second cross-sectional view 275 of the structure taken along the line X-X' shown in FIG. 2A. FIGS. 2A, 2B and 2C are collectively referred to as FIG. 2. The FIG. 2 structure includes a substrate 202, an etch stop layer 204, a sacrificial layer 205, a channel stack 206 and sacrificial layers 207.

The substrate 202 may be formed of Si. The horizontal thickness or width of the substrate 202 in direction X-X' and Y-Y' may vary as desired, such as based on the number of fins that will ultimately be formed.

The etch stop layer 204 may be formed of SiGe in some embodiments. The etch stop layer 204 may have a vertical thickness ranging from 10 nanometers (nm) to 30 nm in some embodiments.

The sacrificial layer 205 may be formed of Si in some embodiments. The sacrificial layer 205 may have a vertical thickness ranging from 10 nm to 100 nm in some embodiments.

The channel stack 206 may include a set of nanosheets formed of Si in some embodiments. Each nanosheet in the channel stack 206 may have a vertical thickness ranging from 3 nm to 15 nm in some embodiments.

The sacrificial layers 207 may be formed of SiGe in some embodiments. Each sacrificial layer 207 may have a vertical thickness ranging from 5 nm to 25 nm in some embodiments.

The bottom sacrificial layer 205 can be SiGe. In this case, the etch stop layer 204 is not required, but a thin etch stop layer of Si may be added between the bottom sacrificial layer 205 and the bottom one of the sacrificial layers 207. Although the FIG. 2 structure is described above using alternating layers of Si and SiGe, or a $Si_{1-x}Ge_x$ material system, embodiments are not limited to use with a $Si_{1-x}Ge_x$ material system. In other embodiments, the alternating layers may be formed of other materials such as Group III-V materials. For example, the substrate 202 may be formed of indium phosphide (InP), with indium gallium arsenide (InGaAs) being used for the channel stack 206. In such an arrangement, the sacrificial layer 205 would be formed from InGaAs and the sacrificial layers 207 would by InP. Various other combinations of materials may be used.

Although FIG. 2 shows a structure with three nanosheets in the channel stack 206, this is not a requirement. The particular number of nanosheets in the channel stack 206 may vary as desired. The structure shown in FIG. 2 may be formed by epitaxial growth of alternating layers of Si and SiGe. The carrier transport direction 201 is shown in FIG. 2A. In some embodiments, the carrier transport direction 201 or the channel direction can be <110>although other directions may be used in other embodiments.

Figure 3A:
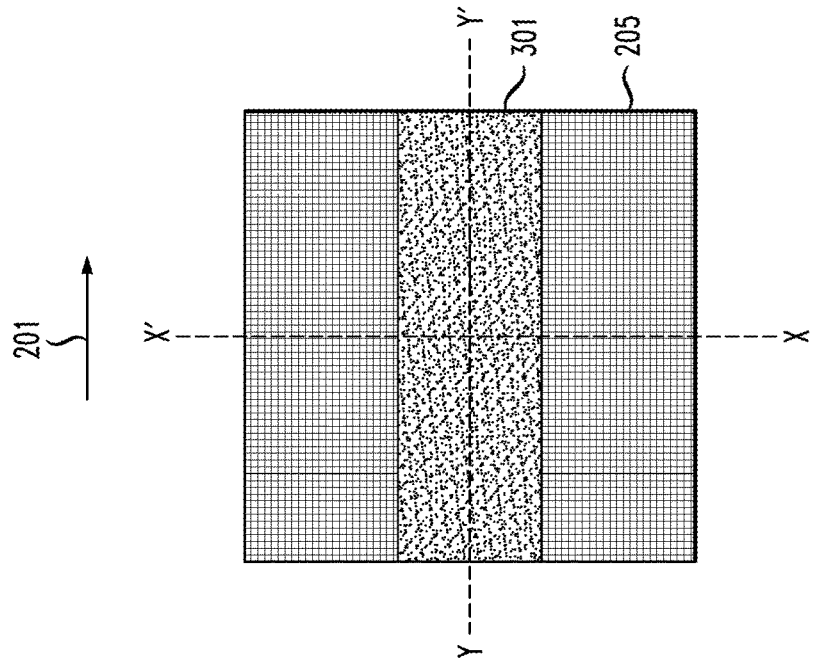
FIG. 3A illustrates a top-down view of the structure shown in FIGS. 2A-2C following fin etching, according to an embodiment of the present invention.

FIG. 3A illustrates a top-down view 300 of a structure. FIG. 3B illustrates a first cross-sectional view 350 of the structure taken along the line Y-Y' shown in FIG. 3A. FIG. 3C illustrates a second cross-sectional view 375 of the structure taken along the line X-X' shown in FIG. 3A. FIGS. 3A, 3B and 3C are collectively referred to as FIG. 3. FIG. 3 shows the FIG. 2 structure following deposition and patterning of a hard mask layer 301 and etching to reveal fin 303.

A hard mask layer 301 may be deposited over the top of the FIG. 2 structure and then patterned to form fins. The hard mask layer 301 may be silicon nitride (SiNx), although other suitable materials such as silicon oxynitride (SiON), silicon carbide oxide (SiCO) and silicon boron carbide nitride (SiBCN) may be used.

The fin 303 may have a horizontal thickness or width in direction X-X' ranging from 10 nm to 100 nm in some embodiments. Although FIG. 3 illustrates an example where a single fin is formed, embodiments are not limited to such an arrangement. Instead, the hard mask layer 301 may be patterned as desired to form multiple fins. After patterning the hard mask layer 301, the fin 303 may be formed by reactive-ion etching (ME). As illustrated in FIG. 3C, the ME removes portions of the channel stack 206 and sacrificial layers 207 which are not covered by the hard mask layer 301, and also continues through and etches a portion of the sacrificial layer 205.

FIG. 4A illustrates a top-down view 400 of a structure. FIG. 4B illustrates a first cross-sectional view 450 of the structure taken along the line Y-Y' shown in FIG. 4A. FIG. 4C illustrates a second cross-sectional view 475 of the structure taken along the line X-X' shown in FIG. 4A. FIGS. 4A, 4B and 4C are collectively referred to as FIG. 4. FIG. 4 shows the FIG. 3 structure following formation of an additional layer on the sidewalls of the fin.

The additional layer may be the same material as the hard mask layer 301, such as SiNx, and is formed by conformal deposition and directional etch back. The additional layer and the hard mask layer 301 are collectively referred to as a mask layer and are labeled 401 in FIGS. 4A and 4B as well as in subsequent figures discussed below. FIG. 4C more particularly shows the additional layer as added portions 403, 405 on the sidewalls of the fin 303, relative to the existing hard mask layer 301 shown in dashed outline for clarity. The added portions 403, 405 may have a horizontal thickness or width in direction X-X' ranging from 1 nm to 10 nm in some embodiments.

FIG. 5A illustrates a top-down view 500 of a structure. FIG. 5B illustrates a first cross-sectional view 550 of the structure taken along the line Y-Y' shown in FIG. 5A. FIG. 5C illustrates a second cross-sectional view 575 of the structure taken along the line X-X' shown in FIG. 5A. FIGS. 5A, 5B and 5C are collectively referred to as FIG. 5. FIG. 5 shows the FIG. 4 structure following etching of the sacrificial layer 205, specifically the exposed portions of the sacrificial layer 205 (e.g., the portions of sacrificial layer 205 not covered by the mask layer 401). The sacrificial layer 205 may be etched using RIE. The ME continues until reaching the etch stop layer 204.

Figure 6C:
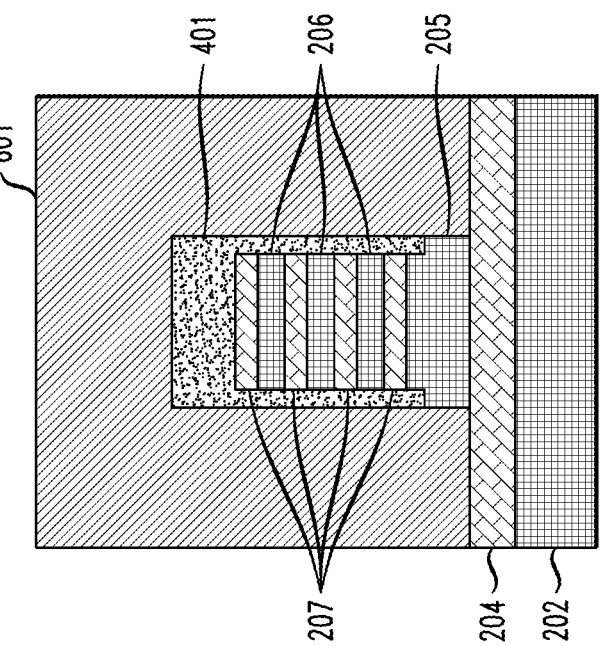
FIG. 6C illustrates a second cross-sectional view of the FIG. 6A structure, according to an embodiment of the present invention.

FIG. 6A illustrates a top-down view 600 of a structure. FIG. 6B illustrates a first cross-sectional view 650 of the structure taken along the line Y-Y' shown in FIG. 6A. FIG. 6C illustrates a second cross-sectional view 675 of the structure taken along the line X-X' shown in FIG. 6A. FIGS. 6A, 6B and 6C are collectively referred to as FIG. 6. FIG. 6 shows the FIG. 5 structure following formation of anchors 601.

The anchors 601 may be formed of $SiO_2$ in some embodiments, although other suitable materials such as SiNx and amorphous silicon (a-Si) may be used in other embodiments. The anchors are formed to surround the fin 303 as illustrated in FIG. 6C, and also protrude above a top of the mask layer 401 as illustrated in FIGS. 6A and 6B. The protruding portion of the anchors 601, or the vertical thickness of the anchors 601 above the top of the mask layer 401, may range from 10 nm to 50 nm in some embodiments. The anchors 601 may be formed using flowable oxide deposition or a high aspect ratio deposition process, followed by chemical mechanical planarization (CMP) and patterning processes (e.g., lithography and directional ME). The anchors 601 anchor the FIG. 6 structure for etching the remaining portion of the sacrificial layer 205 in subsequent processing described below.

Figure 7A:
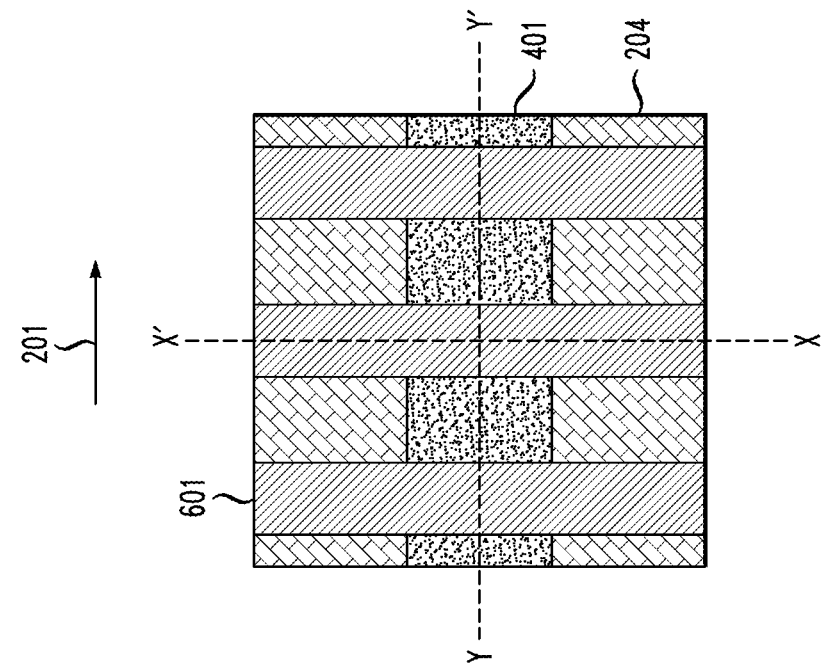
FIG. 7A illustrates a top-down view of the structure shown in FIGS. 6A-6C following selective removal of a sacrificial layer, according to an embodiment of the present invention.
Figure 7C:
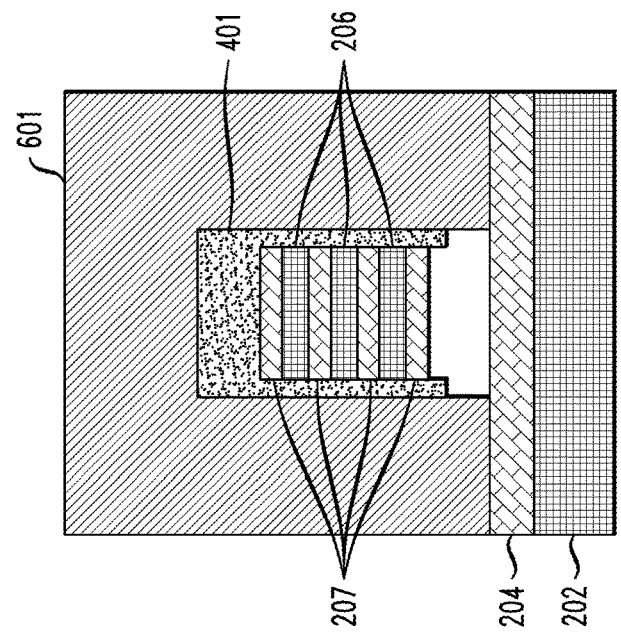
FIG. 7C illustrates a second cross-sectional view of the FIG. 7A structure, according to an embodiment of the present invention.
Figure 7B:
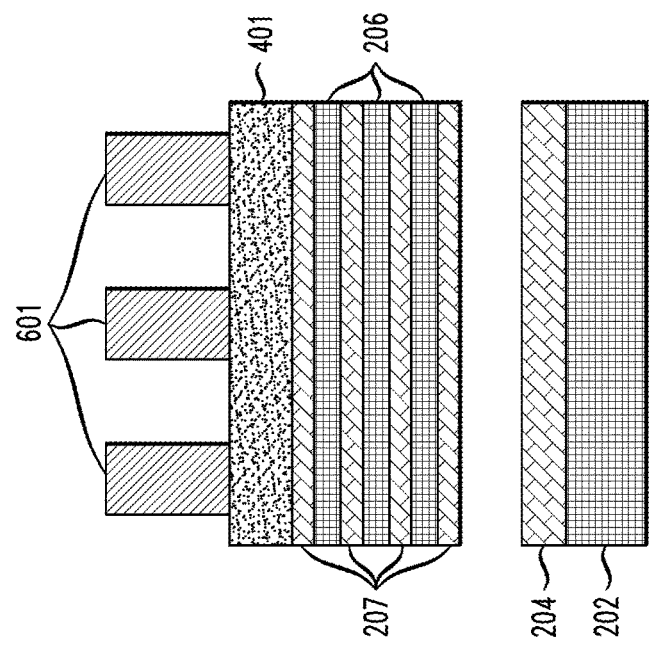
FIG. 7B illustrates a first cross-sectional view of the FIG. 7A structure, according to an embodiment of the present invention.

FIG. 7A illustrates a top-down view 700 of a structure. FIG. 7B illustrates a first cross-sectional view 750 of the structure taken along the line Y-Y' shown in FIG. 7A. FIG. 7C illustrates a second cross-sectional view 775 of the structure taken along the line X-X' shown in FIG. 7A. FIGS. 7A, 7B and 7C are collectively referred to as FIG. 7. FIG. 7 shows the FIG. 6 structure following selective removal of the remaining portion of the sacrificial layer 205. As illustrated in FIG. 7C, the undercut etching of the remaining portion of the sacrificial layer 205 is from the channel width direction. Various processes may be used to etch the remaining portion of the sacrificial layer 205, including wet or dry etches such as tetramethylammonium hydroxide (TMAH).

Figure 8C:
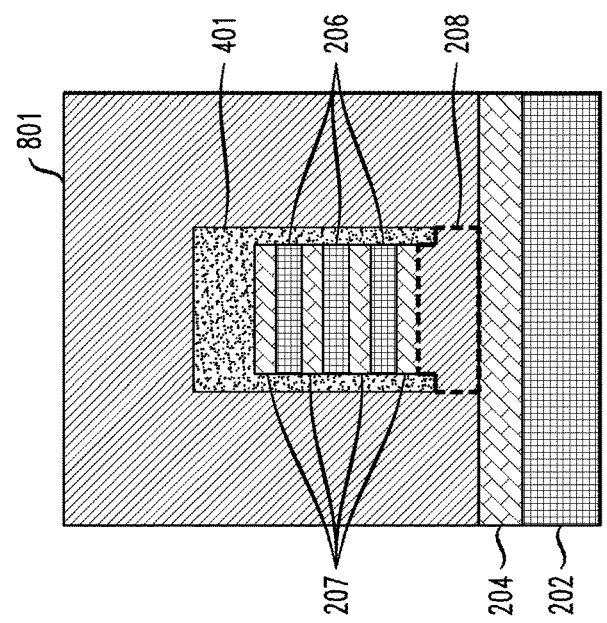
FIG. 8C illustrates a second cross-sectional view of the FIG. 8A structure, according to an embodiment of the present invention.

FIG. 8A illustrates a top-down view 800 of a structure. FIG. 8B illustrates a first cross-sectional view 850 of the structure taken along the line Y-Y' shown in FIG. 8A. FIG. 8C illustrates a second cross-sectional view 875 of the structure taken along the line X-X' shown in FIG. 8A. FIGS. 8A, 8B and 8C are collectively referred to as FIG. 8. FIG. 8 shows the FIG. 7 structure following a fill with an oxide 801.

The oxide 801 may be SiO$_2$ in some embodiments, although other suitable materials such as SiNx, SiBCN and SiCO may be used in other embodiments. The oxide 801 may be formed by atomic layer deposition (ALD) in some embodiments, although other suitable processes such as flowable oxide chemical vapor deposition (CVD) may be used in other embodiments. The oxide 801 may be filled in the structure by using a flowable oxide fill followed by an annealing process.

The oxide 801 is shown formed between the anchors 601, as well as replacing the sacrificial layer 205 removed as described above with respect to FIG. 7. FIG. 8B illustrates the fill between the anchors 601 as the anchors 601 are shown in dashed outline. FIG. 8C illustrates the fill of the area replacing the sacrificial layer 205 by showing, in dashed outline, bottom isolation layer 208 which will be described in further detail below.

Figure 9A:
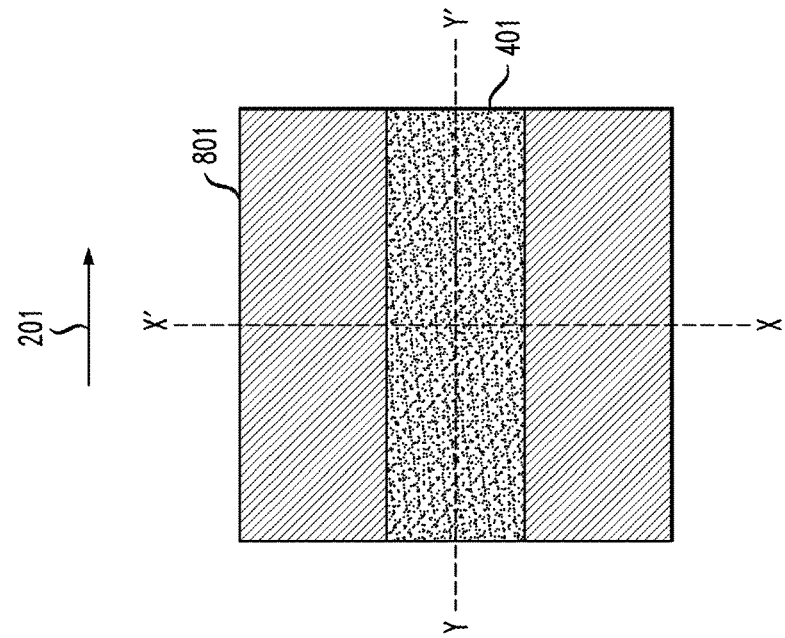
FIG. 9A illustrates a top-down view of the structure shown in FIGS. 8A-8C following chemical mechanical planarization, according to an embodiment of the present invention.
Figure 9C:
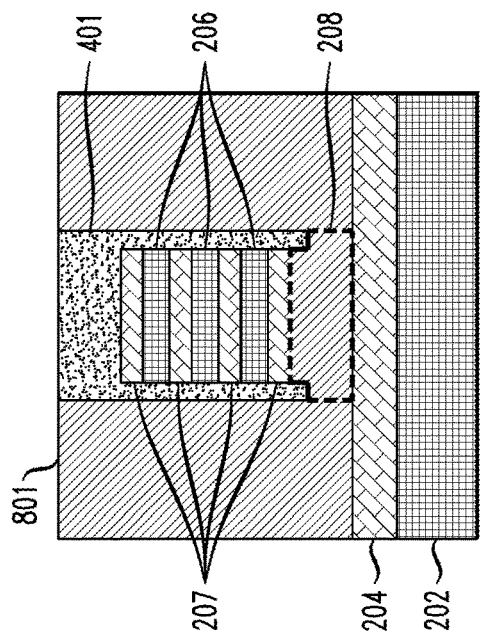
FIG. 9C illustrates a second cross-sectional view of the FIG. 9A structure, according to an embodiment of the present invention.
Figure 9B:
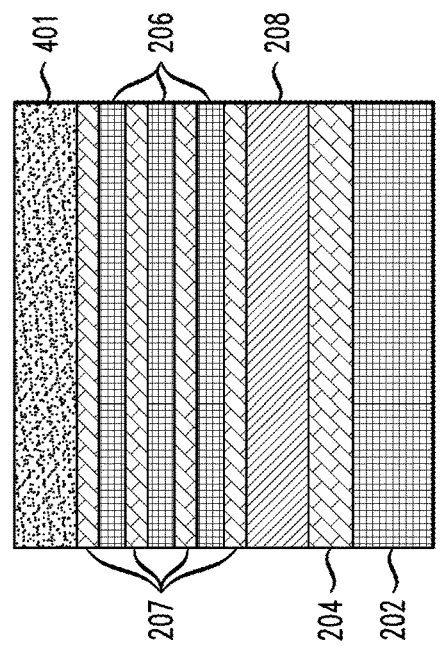
FIG. 9B illustrates a first cross-sectional view of the FIG. 9A structure, according to an embodiment of the present invention.

FIG. 9A illustrates a top-down view 900 of a structure. FIG. 9B illustrates a first cross-sectional view 950 of the structure taken along the line Y-Y' shown in FIG. 9A. FIG. 9C illustrates a second cross-sectional view 975 of the structure taken along the line X-X' shown in FIG. 9A. FIGS. 9A, 9B and 9C are collectively referred to as FIG. 9. FIG. 9 shows the FIG. 8 structure following CMP of the oxide 801 down to the mask layer 401.

Figure 10B:
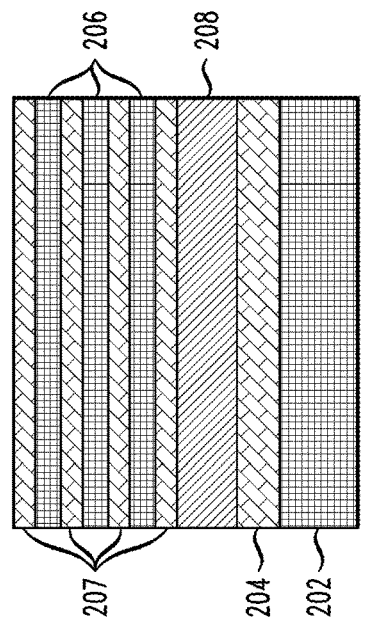
FIG. 10B illustrates a first cross-sectional view of the FIG. 10A structure, according to an embodiment of the present invention.
Figure 10A:
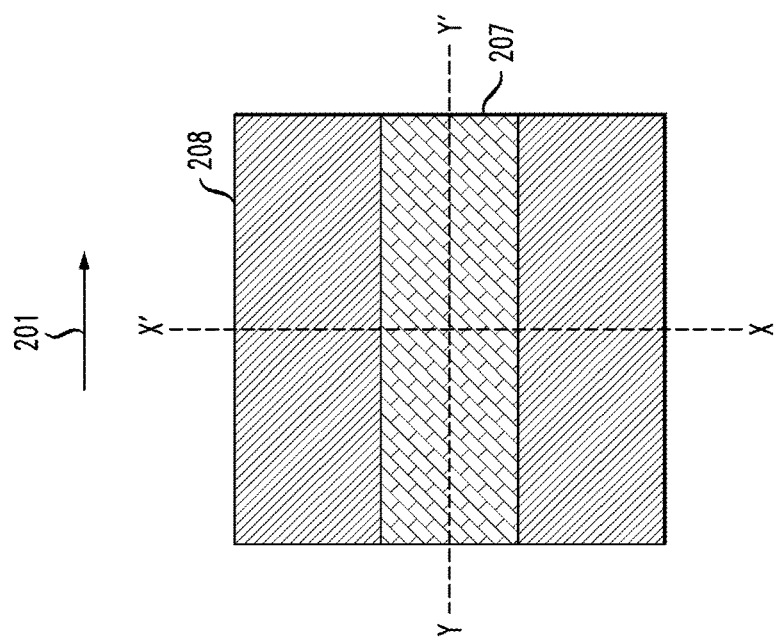
FIG. 10A illustrates a top-down view of the structure shown in FIGS. 9A-9C following fin reveal, according to an embodiment of the present invention.
Figure 10C:
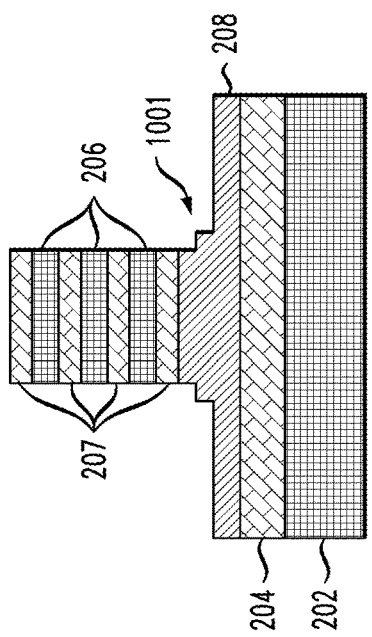
FIG. 10C illustrates a second cross-sectional view of the FIG. 10A structure, according to an embodiment of the present invention.

FIG. 10A illustrates a top-down view 1000 of a structure. FIG. 10B illustrates a first cross-sectional view 1050 of the structure taken along the line Y-Y' shown in FIG. 10A. FIG. 10C illustrates a second cross-sectional view 1075 of the structure taken along the line X-X' shown in FIG. 10A. FIGS. 10A, 10B and 10C are collectively referred to as FIG. 10. FIG. 10 shows the FIG. 9 structure following fin reveal by etching of the oxide 801 and removal of the mask layer 401. The resulting structure includes bottom isolation layer 208, which may have a step structure 1001 shown in FIG. 10C depending on how deep the reveal etch goes.

Figure 11A:
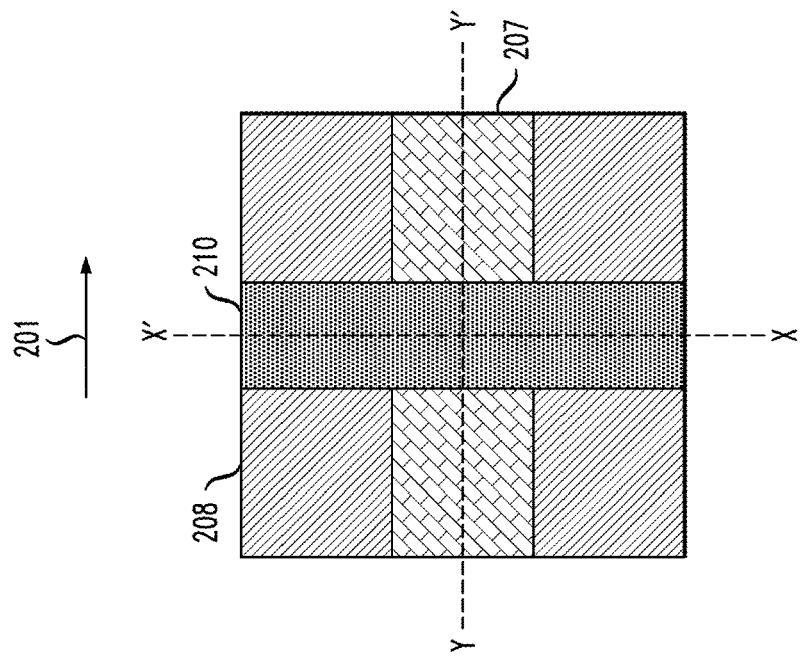
FIG. 11A illustrates a top-down view of the structure shown in FIGS. 10A-10C following formation of a dummy gate, according to an embodiment of the present invention.
Figure 11C:
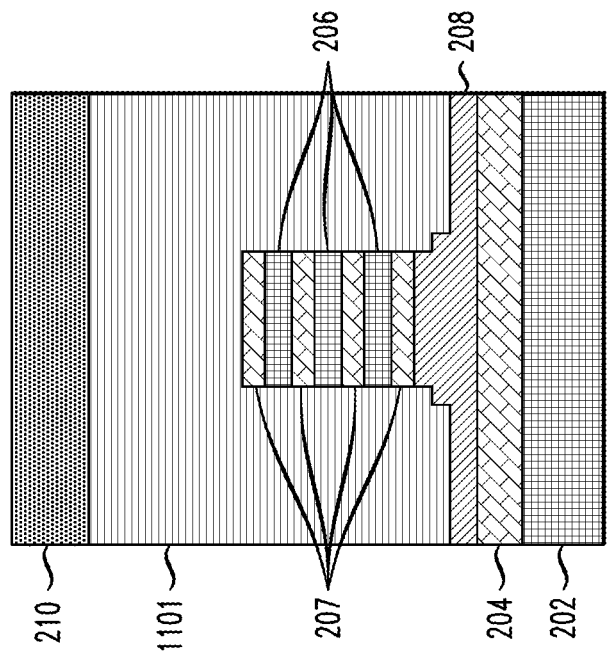
FIG. 11C illustrates a second cross-sectional view of the FIG. 11A structure, according to an embodiment of the present invention.
Figure 11B:
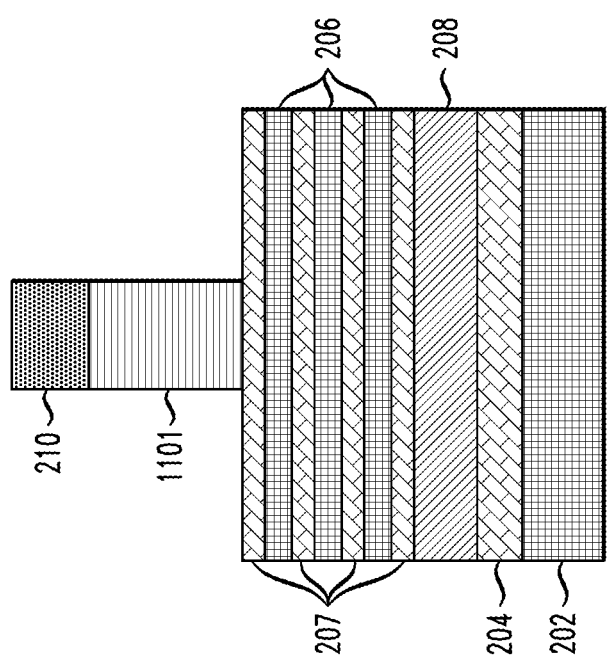
FIG. 11B illustrates a first cross-sectional view of the FIG. 11A structure, according to an embodiment of the present invention.

FIG. 11A illustrates a top-down view 1100 of a structure. FIG. 11B illustrates a first cross-sectional view 1150 of the structure taken along the line Y-Y' shown in FIG. 11A. FIG. 11C illustrates a second cross-sectional view 1175 of the structure taken along the line X-X' shown in FIG. 11A. FIGS. 11A, 11B and 11C are collectively referred to as FIG. 11. FIG. 11 shows the FIG. 10 structure following formation of a dummy gate 1101 and a top hard mask 210 over the dummy gate 1101.

The dummy gate 1101 may be formed of poly-Si in some embodiments. The dummy gate 1101 may have a vertical thickness, relative to the top sacrificial layer 207, ranging from 30 nm to 100 nm in some embodiments. The dummy gate may have a horizontal thickness or width in direction Y-Y' ranging from 6 nm to 200 nm in some embodiments.

The top hard mask 210 may be formed of SiNx in some embodiments. The top hard mask 210 may have a vertical thickness, relative to the top of dummy gate 1101, ranging from 5 nm to 50 nm in some embodiments.

Although FIG. 11 shows a single dummy gate 1101 formed over a portion of the single fin 303, it is to be appreciated that embodiments are not limited to this arrangement. As discussed above, multiple fins may be formed in a structure. In such cases, one or more dummy gates may be formed over each of the fins. A single dummy gate may also be formed over portions of at least two different fins.

The dummy gate 1101 may be formed by depositing poly-Si over the entire FIG. 10 structure, followed by formation and patterning of the top hard mask 210 and removal of poly-Si that is not covered by the patterned top hard mask 210.

Figure 12B:
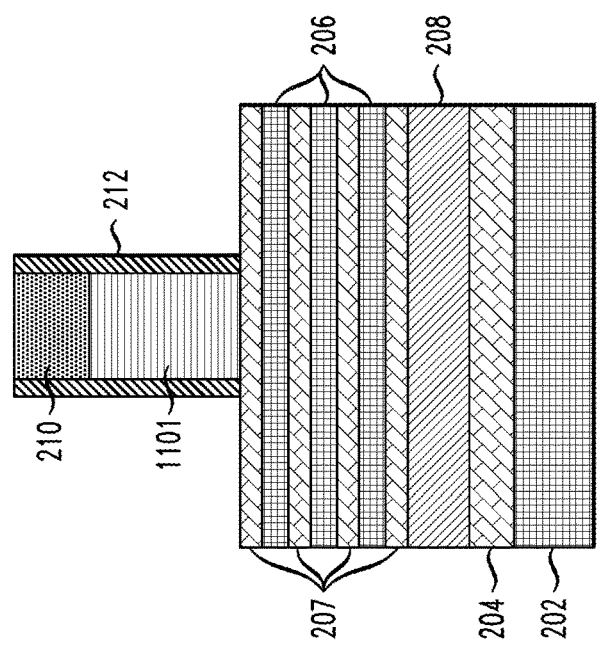
FIG. 12B illustrates a first cross-sectional view of the FIG. 12A structure, according to an embodiment of the present invention.
Figure 12A:
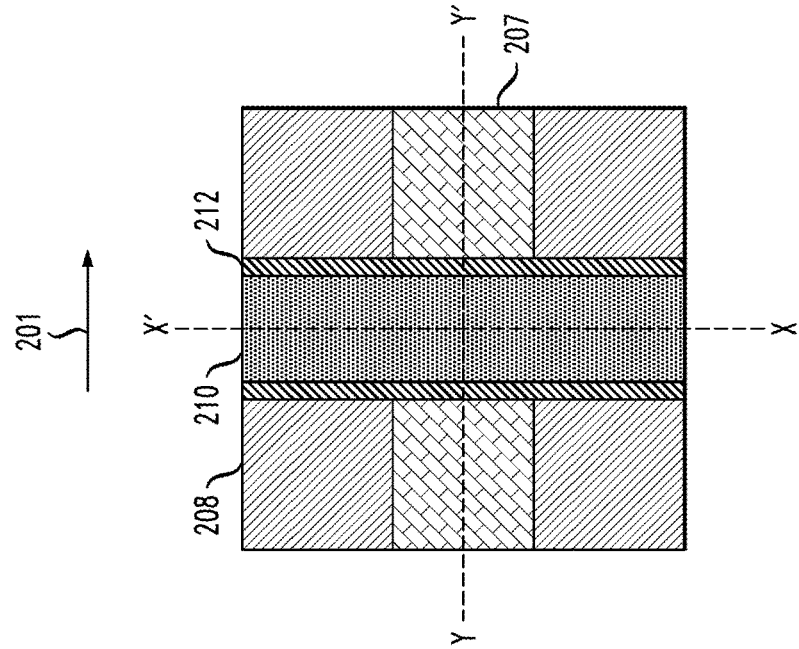
FIG. 12A illustrates a top-down view of the structure shown in FIGS. 11A-11C following formation of a gate spacer, according to an embodiment of the present invention.

FIG. 12A illustrates a top-down view 1200 of a structure. FIG. 12B illustrates a first cross-sectional view 1250 of the structure taken along the line Y-Y' shown in FIG. 12A. FIG. 12C illustrates a second cross-sectional view 1275 of the structure taken along the line X-X' shown in FIG. 12A. FIGS. 12A, 12B and 12C are collectively referred to as FIG. 12. FIG. 12 shows the FIG. 11 structure following formation of a gate spacer 212.

The gate spacer 212 may be formed of SiBCN in some embodiments, although other although other suitable materials such as SiN, SiCO or silicon oxycarbonitride (SiOCN) may be used in other embodiments. The gate spacer 212 may have a horizontal thickness or width in direction Y-Y' ranging from 3 nm to 10 nm in some embodiments.

FIG. 13A illustrates a top-down view 1300 of a structure. FIG. 13B illustrates a first cross-sectional view 1350 of the structure taken along the line Y-Y' shown in FIG. 13A. FIG. 13C illustrates a second cross-sectional view 1375 of the structure taken along the line X-X' shown in FIG. 13A. FIGS. 13A, 13B and 13C are collectively referred to as FIG. 13. FIG. 13 shows the FIG. 12 structure following etching of portions of the channel stack 206 and the sacrificial layers 207.

As illustrated in FIG. 13, the portions of the channel stack 206 and the sacrificial layers 207 which are not covered by the top hard mask 210 and the gate spacer 212 are removed. Etching of the portions of the channel stack 206 and the sacrificial layers 207 may utilize RIE, such as a directional RIE which removes the exposed portions of the channel stack 206 and the sacrificial layer 207 until reaching the bottom isolation layer 208.

Figure 14A:
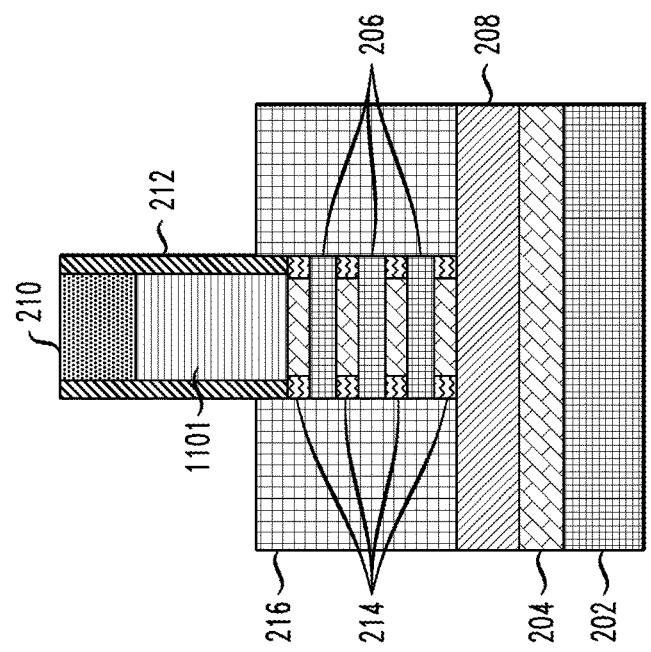
FIG. 14A illustrates a top-down view of the structure shown in FIGS. 13A-13C following formation of an inner spacer and epitaxial growth, according to an embodiment of the present invention.
Figure 14B:
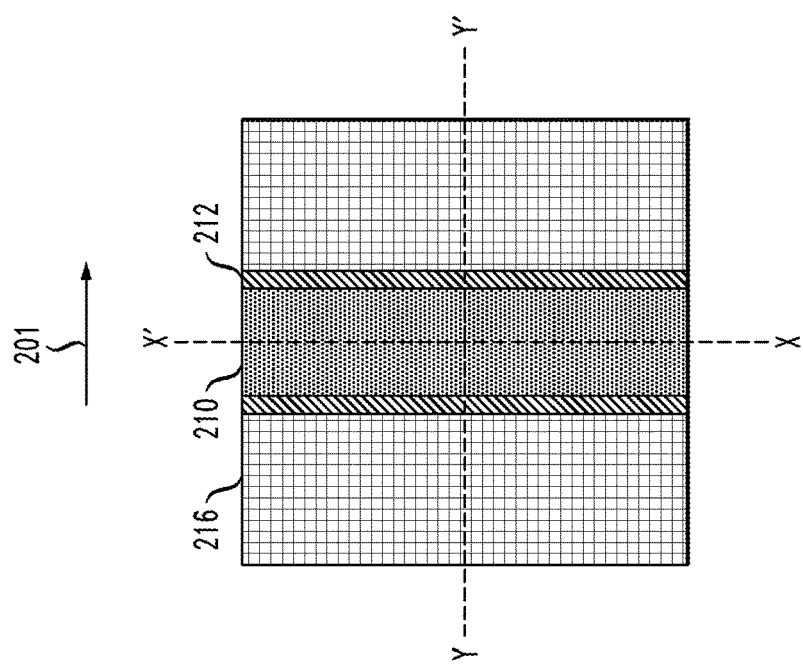
FIG. 14B illustrates a first cross-sectional view of the FIG. 14A structure, according to an embodiment of the present invention.

FIG. 14A illustrates a top-down view 1400 of a structure. FIG. 14B illustrates a first cross-sectional view 1450 of the structure taken along the line Y-Y' shown in FIG. 14A. FIG. 14C illustrates a second cross-sectional view 1475 of the structure taken along the line X-X' shown in FIG. 14A. FIGS. 14A, 14B and 14C are collectively referred to as FIG. 14. FIG. 14 shows the FIG. 13 structure following formation of inner spacers 214 and epitaxial layers 216.

The inner spacers 214 may be formed of SiNx in some embodiments, although other suitable materials such as SiBCN, SiCO or SiOCN may be used in other embodiments. The inner spacers 214 may be formed using an indent etch of the SiGe sacrificial layers 207, conformal deposition of SiNx and then conformal etch back of the SiNx. The inner spacers 214 may have a horizontal width or thickness in direction Y-Y' ranging from 2 nm to 10 nm in some embodiments.

Epitaxial layers 216 may form source/drain regions for a resulting structure. The epitaxial layers 216 may have a height or vertical thickness, from the top of the bottom isolation layer 208, ranging from 40 nm to 100 nm in some embodiments.

Figure 15C:
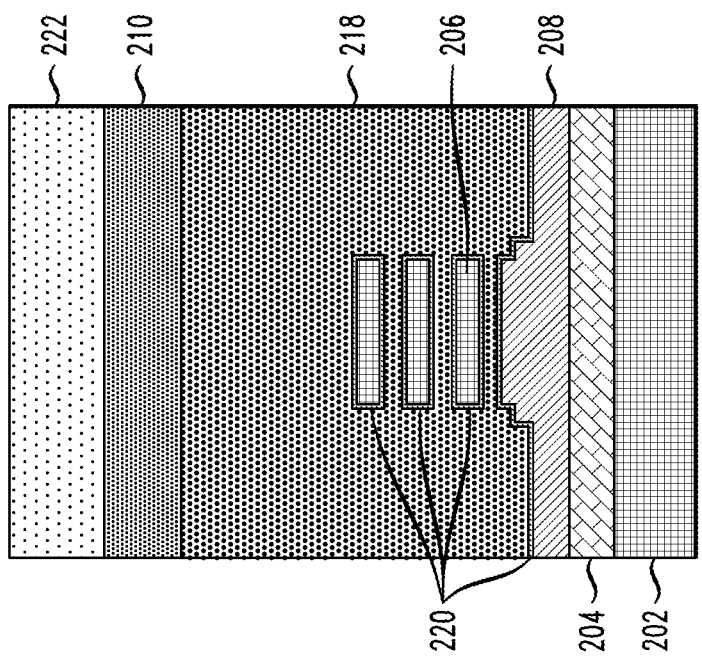
FIG. 15C illustrates a second cross-sectional view of the FIG. 15A structure, according to an embodiment of the present invention.
Figure 15B:
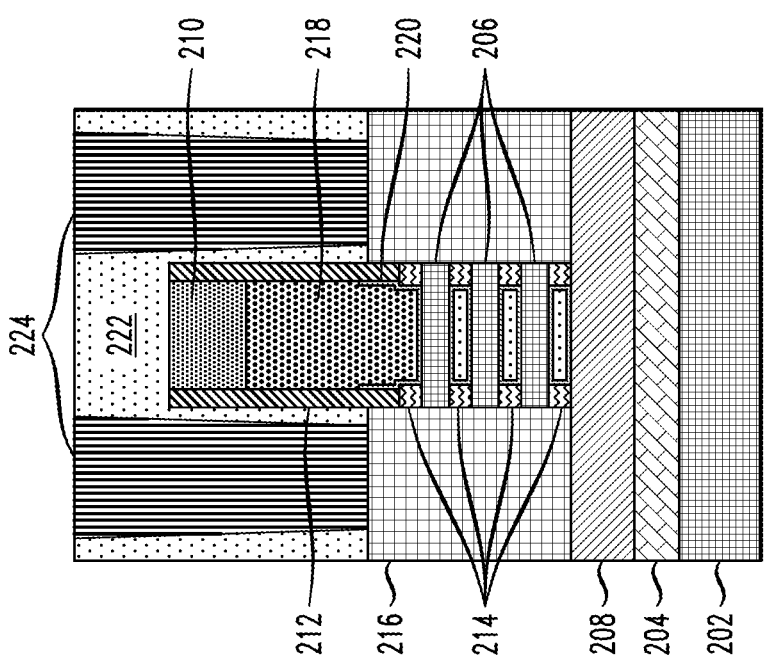
FIG. 15B illustrates a first cross-sectional view of the FIG. 15A structure, according to an embodiment of the present invention.

FIG. 15A illustrates a top-down view 1500 of a structure. FIG. 15B illustrates a first cross-sectional view 1550 of the structure taken along the line Y-Y' shown in FIG. 15A. FIG. 15C illustrates a second cross-sectional view 1575 of the structure taken along the line X-X' shown in FIG. 15A. FIGS. 15A, 15B and 15C are collectively referred to as FIG. 15. FIG. 15 shows the FIG. 14 structure following formation of contacts 224 and other processing described below.

As illustrated, the dummy gate 1101 and sacrificial layers 207 are replaced with a gate metal 218. This may performed using a poly-Si and SiGe pull process. The gate metal 218 may be formed of titanium nitride (TiN), tungsten (W) or another suitable material.

The gate metal 218 is surrounded by a high-k dielectric layer 220 to cover the channel surfaces. The high-k dielectric layer 220 may have a thickness ranging from 1 nm to 3 nm in some embodiments.

Contacts 224 are formed to contact the source/drain regions of epitaxial layers 216. The contacts 224 may be formed of a titanium (Ti) liner and W in some embodiments. Spaces between the contacts 224 are filled with an interlayer dielectric (ILD) 222, such as $SiO_2$.

In the description above, various materials and dimensions for different elements are provided. Unless otherwise noted, such materials are given by way of example only and embodiments are not limited solely to the specific examples given. Similarly, unless otherwise noted, all dimensions are given by way of example and embodiments are not limited solely to the specific dimensions or ranges given.

Semiconductor devices and methods for forming same in accordance with the above-described techniques can be employed in various applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings provided herein, one of ordinary skill in the art will be able to contemplate other implementations and applications of embodiments of the invention.

In some embodiments, the above-described techniques are used in connection with semiconductor devices that may require, for example, complementary metal-oxide semiconductors (CMOSs), metal-oxide-semiconductor field-effect transistors (MOSFETs), and/or FinFETs. By way of non-limiting example, the semiconductor devices can include, but are not limited to CMOS, MOSFET, and FinFET devices, and/or semiconductor devices that use CMOS, MOSFET, and/or FinFET technology.

Various structures described above may be implemented in integrated circuits. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of forming a semiconductor structure, comprising:
   forming a multi-layer structure comprising a substrate and two or more nanosheet layers formed above the substrate;
   forming a bottom isolation layer between the substrate and the two or more nanosheet layers;
   forming an etch stop layer disposed between the substrate and the bottom isolation layer; and
   performing a fin reveal in the multi-layer structure after formation of the bottom isolation layer to form at least one fin;
   wherein the two or more nanosheet layers provide a channel stack for a nanosheet field-effect transistor; and
   wherein the bottom isolation layer comprises:
      a first portion beneath the channel stack having a first height relative to a top of the etch stop layer;
      a second portion adjacent to sidewalls of the at least one fin having a second height relative to the top of the etch stop layer, the second height being smaller than the first height; and
      a third portion adjacent to the second portion having a third height relative to the top of the etch stop layer, the third height being smaller than the second height.

2. The method of claim 1, wherein forming the multi-layer structure comprises forming alternating layers of a first material and a second material, the multi-layer structure comprising:
   the substrate comprising the first material;
   the etch stop layer formed over the substrate, the etch stop layer comprising the second material;
   a sacrificial layer formed over the etch stop layer, the sacrificial layer comprising the first material; and
   the channel stack formed over the first sacrificial layer, the channel stack comprising the two or more nanosheet layers and two or more additional sacrificial layers, the two or more nanosheet layers comprising the first material and the two or more additional sacrificial layers comprising the second material.

3. The method of claim 2, wherein the first material comprises silicon and the second material comprises silicon germanium.

4. The method of claim 2, further comprising forming at least one wide fin in the multi-layer structure, wherein forming the at least one wide fin comprises:
   patterning a hard mask over a top of the multi-layer structure; and
   removing portions of the channel stack and a portion but not all of the sacrificial layer of the first material exposed by the hard mask.

5. The method of claim 4, further comprising forming an additional layer covering sidewalls of the at least one wide fin, the additional layer being formed by conformal deposition of material of the additional layer followed by directional etch back of the material of the additional layer.

6. The method of claim 5, further comprising etching a remaining portion of the sacrificial layer of the first material not covered by the hard mask and the additional layer down to the etch stop layer.

7. The method of claim 6, further comprising:
forming one or more anchor layers over a top of the at least one wide fin;
removing a remaining portion of the sacrificial layer of the first material that is covered by the hard mask and the additional layer to form an empty space in the at least one wide fin; and
filling the empty space with an oxide.

8. The method of claim 1, further comprising forming the bottom isolation layer without performing any oxidation.

9. A semiconductor structure, comprising:
a multi-layer structure comprising a substrate and two or more nanosheet layers disposed above the substrate;
a bottom isolation layer disposed between the substrate and the two or more nanosheet layers; and
an etch stop layer disposed between the substrate and the bottom isolation layer;
wherein the two or more nanosheet layers provide a channel stack for a nanosheet field-effect transistor;
wherein the bottom isolation layer comprises:
a first portion beneath the channel stack having a first height relative to a top of the etch stop layer;
a second portion adjacent to sidewalls of the channel stack having a second height relative to the top of the etch stop layer, the second height being smaller than the first height; and
a third portion adjacent to the second portion having a third height relative to the top of the etch stop layer, the third height being smaller than the second height.

10. The semiconductor structure of claim 9, wherein the channel stack comprises two or more layers of gate metal disposed between the two or more nanosheet layers and a high-k dielectric layer surrounding the gate metal.

11. The semiconductor structure of claim 10, further comprising an outer spacer layer disposed on sidewalls of the channel stack.

12. The semiconductor structure of claim 11, further comprising epitaxial layers disposed over the bottom isolation layer surrounding the outer spacer layer disposed on sidewalls of the channel stack.

13. The semiconductor structure of claim 9, wherein the two or more nanosheet layers comprise silicon and the etch stop layer comprises silicon germanium.

14. An integrated circuit comprising:
a nanosheet field-effect transistor comprising:
a multi-layer structure comprising a substrate and two or more nanosheet layers disposed above the substrate;
a bottom isolation layer disposed between the substrate and the two or more nanosheet layers; and
an etch stop layer disposed between the substrate and the bottom isolation layer;
wherein the two or more nanosheet layers provide a channel stack for a nanosheet field-effect transistor; and
wherein the bottom isolation layer comprises:
a first portion beneath the channel stack having a first height relative to a top of the etch stop layer;
a second portion adjacent to sidewalls of the channel stack having a second height relative to the top of the etch stop layer, the second height being smaller than the first height; and
a third portion adjacent to the second portion having a third height relative to the top of the etch stop layer, the third height being smaller than the second height.

15. The integrated circuit of claim 14, wherein the channel stack comprises two or more layers of gate metal disposed between the two or more nanosheet layers and a high-k dielectric layer surrounding the gate metal.

16. The integrated circuit of claim 15, further comprising an outer spacer layer disposed on sidewalls of the channel stack.

17. The integrated circuit of claim 16, further comprising epitaxial layers disposed over the bottom isolation layer surrounding the outer spacer layer disposed on sidewalls of the channel stack.

18. The integrated circuit of claim 14, wherein the two or more nanosheet layers comprise silicon and the etch stop layer comprises silicon germanium.

* * * * *